United States Patent [19]

Ho et al.

[11] 4,209,349
[45] Jun. 24, 1980

[54] METHOD FOR FORMING A NARROW DIMENSIONED MASK OPENING ON A SILICON BODY UTILIZING REACTIVE ION ETCHING

[75] Inventors: Irving T. Ho; Jacob Riseman, both of Poughkeepsie, N.Y.

[73] Assignee: International Business Machines Corp., Armonk, N.Y.

[21] Appl. No.: 957,605

[22] Filed: Nov. 3, 1978

[51] Int. Cl.² .................... H01L 21/302; H01L 21/76
[52] U.S. Cl. ................................... 148/187; 29/578;
148/1.5; 148/174; 148/175; 156/643; 156/653;
156/657; 156/662; 204/192 E; 357/20; 357/49;
357/50; 357/54; 357/56
[58] Field of Search ............... 148/1.5, 174, 175, 187;
204/192 E; 156/643, 644, 653, 657, 662;
427/93; 29/578; 357/20, 49, 50, 54, 56

[56] References Cited

U.S. PATENT DOCUMENTS

| | | | |
|---|---|---|---|
| 3,799,777 | 3/1974 | O'Keefe et al. | 156/643 X |
| 3,966,577 | 6/1976 | Hochberg | 156/653 X |
| 4,026,740 | 5/1977 | Owen | 156/657 X |
| 4,037,307 | 7/1977 | Smith | 29/578 X |
| 4,042,726 | 8/1977 | Kaji et al. | 357/50 X |
| 4,063,992 | 12/1977 | Hosack | 156/653 |
| 4,103,415 | 8/1978 | Hayes | 29/578 X |
| 4,124,933 | 11/1978 | Nicholas | 148/187 X |
| 4,139,442 | 2/1979 | Bondur et al. | 204/192 E |
| 4,160,991 | 7/1979 | Anantha et al. | 357/49 |

OTHER PUBLICATIONS

Critchlow, D. L., "High Speed Mosfet . . . Advanced Lithography" Computer, vol. 9, No. 2, Feb. 1976, pp. 31-37.
Pogge, H. B., "Narrow Line Widths Masking Method" I.B.M. Tech. Discl. Bull., Nov. 1976, vol. 19, No. 6.
Abbas et al., "Extending Minimal Dimensions . . . Fabrication Processing" I.B.M. Tech. Discl. Bull., vol. 20, No. 4, Sep. 1977, pp. 1376-1378.
Bersin, R. L., "Survey of Plasma-Etching Processes" Solid State Tech., May 1976, pp. 31-36.
Jambotkar, C. G., "Method for Reducing Emitter-Base Contact . . . " I.B.M. Tech. Discl. Bull., vol. 19, No. 12, May 1977, pp. 4601-4604.

*Primary Examiner*—L. Dewayne Rutledge
*Assistant Examiner*—W. G. Saba
*Attorney, Agent, or Firm*—George O. Saile

[57] ABSTRACT

A method for forming a narrow, such as a submicrometer, dimensioned mask opening on a silicon body involving forming a first insulator region having substantially a horizontal surface and a substantially vertical surface. A second insulator is applied on both the horizontal surface and substantially vertical surfaces. The second insulator is composed of a material different from that of the first insulator layer. Reactive ion etching of the second layer removes the horizontal layer and provides a narrow dimensioned second insulator region on the silicon body. The surface of the silicon body is then thermally oxidized. The narrow dimensioned second insulator region is removed to form a narrow dimensioned mask opening.

20 Claims, 17 Drawing Figures

METHOD FOR FORMING A NARROW DIMENSIONED MASK OPENING ON A SILICON BODY UTILIZING REACTIVE ION ETCHING

DESCRIPTION

Technical Field

This invention relates to methods for forming highly dense and very small, integrated circuit semiconductor devices, and more particularly, to forming mask openings on a silicon body which opening is in the submicrometer size.

CROSS-REFERENCE TO OTHER PATENT APPLICATIONS (1) Patent application Ser. No. 957,606 filed like date entitled, "Method for Forming An Insulator Between Layers of Conductive Material" by J. Riseman (FI9-78-021).

(2) Patent application Ser. No. 957,604 filed like date entitled, "Method for Forming a Narrow Dimensioned Region on a Body" by H. B. Pogge (FI9-78-022).

(3) Patent application Ser. No. 957,599 filed like date entitled, "Method for Forming Diffusions Having Narrow Dimensions" by I. T. Ho and J. Riseman (FI9-78-024).

BACKGROUND ART

There has been a dramatic increase in the complexity of silicon integrated circuits over the past ten years. As applications develop for microprocesses and minicomputers there is an increasing demand for greater complexities, higher switching speeds, and smaller devices in the integrated circuit. The major technology in the semiconductor process which allows this increase complexity of integrated circuits is the lithographic technology. Over the past few years only modest reductions in line widths were achieved. It has been the photolithographic defect level reductions which have allowed the high levels of integration to be achieved. There has been a gradual decrease in line widths from about 5 to 10 micrometers to about 3 to 5 micrometers at the present time. Light has been used almost exclusively until the present time in the lithographic process. However, optical resolution limits make further advances much more difficult. The thrust today is to non-light lithography, and in particular to electron beam and X-ray exposure processes to achieve the higher packing densities required for the future. These problems and their possible solutions are discussed in greater detail by B. L. Critchlow in the publication entitled, "High Speed MOSFET circuits Using Advanced Lithography," published in the Computer, Volume 9, No. 2, February 1976, pages 31 through 37. In that publication the substantial equipment cost and complexities of X-ray and electron beam lithography are described. However, up until now it has been believed that these were the only alternatives to optical projection printing for high complexity integrated circuit devices of the future. There have been other efforts to obtain narrow line widths in the range of 1 micrometer or less by extending standard photolighography techniques and avoiding the need to use the more expensive and complex techniques such as electron beam or X-ray lithography. One such technique is described by H. B. Pogge in IBM Technical Disclosure Bulletin, November 1976, Volume No. 6, entitled "Narrow Line Widths Masking Method." This method involves the use of a porous silicon followed by oxidation of the porous silicon. Another technique is described by S. A. Abbas, et al, IBM Technical Disclosure Bulletin, Volume 20, No. 4, September 1977, pages 1376 through 1378. This TDB describes the use of polycrystalline silicon masking layers which are made into masks by first using an intermediate mask of oxidation blocking material, such as silicon nitride in the formation of the polycrystalline silicon. Line dimensions below about 2 micrometers may be obtained by this technique.

Plasma or reactive ion etching is a technique which has been developed for etching metals, semiconductor materials and dielectrics in the manufacture of integrated circuit devices. In particular, the method of reactive ion etching which is capable of doing anisotropic etching wherein very high aspect ratios can be obtained, that is the ratio of vertical etching is much greater than the horizontal etching. The process involves the use of a plasma or ionized gas containing a variety of highly reactive particles such as ions, free electrons and free radicals. The plasmas used in etching may be maintained at relatively low temperatures of the order up to 250° C. and low pressures in the range of 0.005 to 20 torr. The particles in the plasma are largely free radicals which cause the plasma's intense reactivity. The ion population in low temperature plasma is of the order of one percent of the particles. "A Survey of Plasma-Etching Processes" by Richard L. Bersin published in Solid State Technology, May 1976, pages 31 through 36 in great detail describe the plasma etching process and its application to semiconductor materials. The process has been used to make trenches or openings in silicon semiconductor bodies of various patterns as shown by Arthur K. Hochberg, U.S. Pat. No. 3,966,577 issued June 29, 1976; J. A. Bondur patent application Ser. No. 824,361 filed Aug. 15, 1977, now U.S. Pat. No. 4,104,086, and assigned to the assignee of the present patent application; and J. A. Bondur, et al, patent application Ser. No. 832,856 filed Sept. 13, 1977, now U.S. Pat. No. 4,139,442, assigned to the assignee of the present patent application. Further information about the process for reactive ion or plasma etching may be more fully understood by reference to the J. N. Harvilchuck, et al, patent application Ser. No. 594,413 filed July 9, 1975, now abandoned, and continuation patent application Ser. No. 822,775 filed Aug. 8, 1977 now abandoned, and continuation patent application Ser. No. 960,322 filed Nov. 13, 1978. The RF induced plasma in the Harvilchuck, et al patent application is reactive chlorine, bromine or iodine specie. A precise description of the RF discharge apparatus and the processing is given in detail in that patent application.

It is the object of the invention to extend the use of conventional lithography techniques to line widths in the submicrometer range by utilizing the plasma or reactive ion etching process.

SUMMARY OF THE PRESENT INVENTION

In accordance with the present invention, a method for forming a narrow dimensioned mask opening on a silicon body is described wherein first insulator regions, such as $SiO_2$, having substantially horizontal surfaces and substantially vertical surfaces is formed on a silicon body. The vertical surface may be the result of a plasma or reactive ion etching process. A second insulator layer composed of a material different from that of the first insulator, such as $Si_3N_4$, is formed on both the substantially horizontal surfaces and substantially vertical surfaces. Reactive ion etching is used to remove the second insulator layer from the horizontal surfaces and to provide a narrow dimensioned second insulator region on the silicon body. The exposed surfaces of the silicon body is thermally oxidized. The submicrometer dimensioned second insulator region which remains on the substantially vertical surfaces is removed by a suitable etching process to form the narrow dimensioned mask opening. This mask opening can now be used for diffusion, ion implantation, conductor deposition, or the like.

The process described in the above paragraph may be used to form a double diffused field effect transistor integrated structure by providing a silicon body having a pattern of monocrystalline silicon regions isolated from one another by dielectric isolation. A first insulator layer is formed or deposited on the surface of the silicon body. Openings are made in the insulator layer in areas where the source and drain for the field effect transistor are to be formed. These openings are made by standard photolithography and etching techniques. The result of forming these openings in the first insulator layer is first insulator regions having substantially horizontal surfaces and substantially vertical surfaces. The next step is to diffuse or implant a P or N type impurity through the openings to form the P or N regions in the silicon body. The choice of P or N type depends upon whether a N channel or a P channel type FET is comtemplated. Where an N channel FET is envisioned a P type impurity is diffused through the openings, and alternatively where a P channel device is to be made a N type impurity is diffused through the openings. A second insulator layer composed of a material different from the first insulator is formed on both the substantially horizontal surfaces and the substantially vertical surfaces. Reactive ion or plasma etching of this second layer to substantially remove the horizontal layer and to provide a narrow dimensioned second insulator region on the silicon body is accomplished. A N or P type impurity is now diffused through the openings which have been reduced in size by the narrow dimensioned second insulator region on the silicon body to form N or P type regions in the silicon body which are deeper and narrower than the former P or N type regions. Where a N channel FET is being made, the dopant type will be N. Where a P channel FET is to be manufactured, the dopant type will be P. Contacts to the source and drains of the FET's and the formation of a gate electrode on the first insulator between each of these sources and drains are made to complete the integrated circuit.

The basic process in the first paragraph above may be modified so as to produce a submicrometer emitter bipolar integrated circuit structure. A silicon body is provided that has a pattern of monocrystalline silicon regions isolated from one another by dielectric isolation. A base region is formed in certain of the monocrystalline silicon regions separated from a collector reach-through region by dielectric isolation. First insulator regions are formed on the silicon body having substantially horizontal surfaces and substantially vertical surfaces. The first insulator can be composed of a conductive polycrystalline layer and a silicon dioxide coating thereover. The conductive polycrystalline silicon can act as the base contact. A second insulator layer composed of a material different from the first insulator is formed on both the horizontal surfaces and the vertical surfaces. Reactive ion etching of the second insulator layer to substantially remove the horizontal layer and to provide narrow dimensioned second insulator regions on the vertical surfaces of the silicon body in areas designated to be the emitters. The exposed surface of the silicon body is thermally oxidized. The narrow dimensioned second insulator regions are removed by suitable etching techniques to form the narrow dimensioned mask openings. The emitters are then diffused or ion implanted through these mask openings to form the very high dense integrated circuit.

DISCLOSURE OF THE INVENTION

Figure 1A:
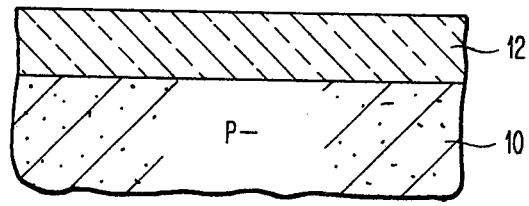
FIGS. 1A through 1G illustrate the basic process of the invention.
Figure 1B:
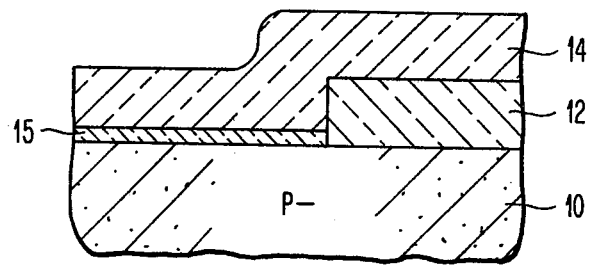
Figure 1C:
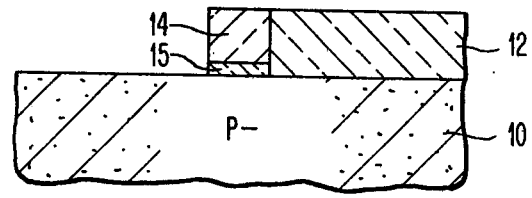
Figure 1D:
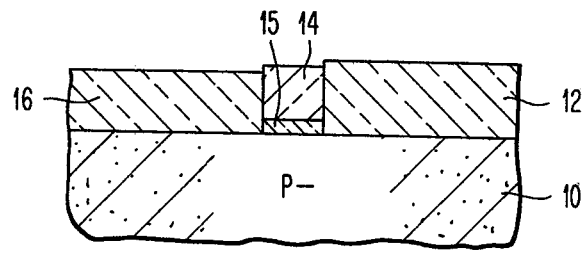

Referring now more particularly to FIGS. 1A through 1E, the basic manufacturing steps for one form of the invention is described. FIG. 1A illustrates one small, greatly enlarged portion of a silicon body which will be used to form a very dense integrated circuit. A monocrystalline silicon body 10 is provided. An insulating layer 12 is formed upon one major surface of the P—monocrystalline silicon region substrate 10. The silicon substrate 10 may, of course, be of any desired conductivity, whether P or N. The layer 12 may be composed of a variety of materials or combinations of materials which include silicon dioxide, silicon nitride, aluminum trioxide, and the like. This first insulating layer 12 is now partially removed as indicated in FIG. 1B by an etching technique which is preferably the reactive ion etching process which is described in more detail in the references cited in the Background Art section above. The reactive ion etching ambient is different depending upon the different insulator layer being etched, as described in the above-referred to "A Survey of Plasma-Etching Processes" by Richard L. Bersin. A second insulator layer 14 is deposited over the surface. The second insulator is composed of a material different from that of the first insulator. It is deposited upon the substantially horizontal surfaces and substantially vertical surfaces which are the result of the etching process of the first insulating layer 12. Where the second insulator is a material such as silicon nitride that causes stressing of silicon when it is directly applied upon the silicon, a very thin layer of silicon dioxide 15 may be first formed by, for example, a thermal oxidation thereunder. The first insulating layer 12 may be, for example, silicon dioxide as well. The FIG. 1B structure is placed in a reactive ion etching ambient which is tailored to remove the second insulator layer 14. Reactive ion etching proceeds to remove the second insulating layer 14 from the substantially horizontal surfaces and have substantially no effect on the substantially vertical surfaces. The result of the reactive ion etching is shown in FIG. 1C wherein only a narrow dimensioned second layer 14 is present on the vertical surfaces. The surfaces of the monocrystalline silicon which are now exposed or having only a thin layer of silicon dioxide 15 thereon are subjected to the thermal oxidation ambient of, for example, oxygen-water vapor at 970° C., to form a thermally grown silicon dioxide layer 16. A preferential chemical etching material is used to remove the silicon nitride layer 14 without affecting the silicon dioxide layer 16 or first insulator layer 14 which may also be silicon dioxide. The thin silicon dioxide layer 15, where present, is also removed by simple chemical etching.

Figure 1E:
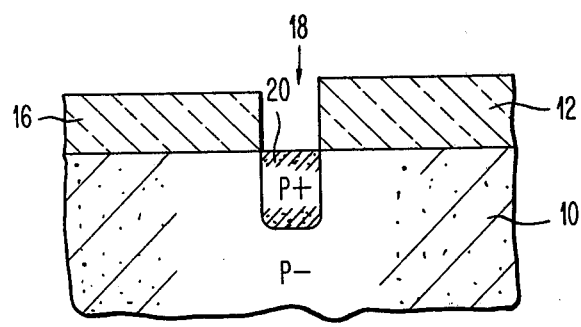

The result is the structure of FIG. 1E wherein a narrow dimensioned mask opening is formed which is directly related to the thickness of the second insulator layer. This thickness of the second insulator layer may be very closely controlled and mask openings in the submicrometer range between about 1000 Å to 10,000 Å may be readily obtained. The next step is to diffuse a dopant through the mask opening 18 by either the thermal diffusion method or the ion implantation method. A P+ diffusion 20 is shown in the present FIG. 1E which may act as, for example, a channel stopper for MOS field effect transistor devices. Diffusions can also be made for junction isolation purposes between bipolar devices.

Figure 1F:
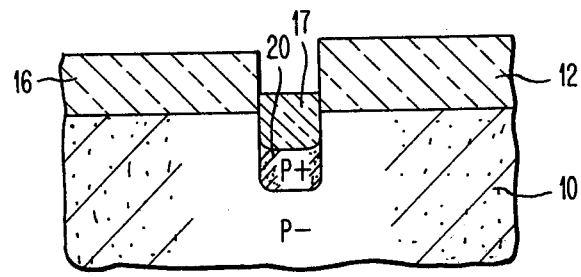
Figure 1G:
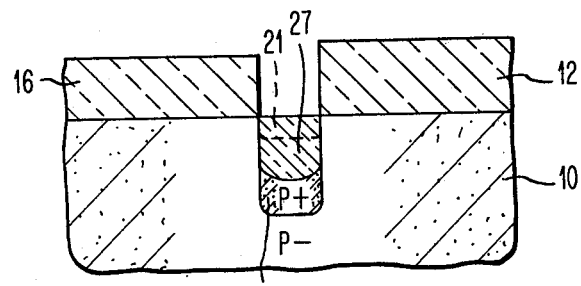

In another alternative, a dielectric channel stopper 17 could be formed through this narrow dimensioned mask opening as shown in FIG. 1F. The dielectric channel stopper is a thermally grown silicon dioxide on top of the P+ diffusion 20. FIG. 1F is conventionally called semi-recess oxide isolation. In yet another alternative, before the process of thermally grown oxide but after the P+ diffusion, a few thousand Angstroms of the monocrystalline silicon 21 is first etched away and then a thermal oxide channel stopper 23 is formed to obtain a more planar dielectric isolation region as shown in FIG. 1G. FIG. 1G is conventionally called a full-recess oxide isolation. The P+ diffusion 20 in FIG. 1F and 1G will enable the channel stopping structure to function more efficiently.

Figure 2A:
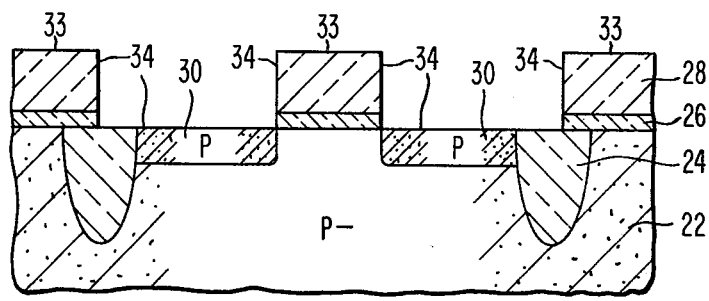
FIGS. 2A through 2D illustrate a method for forming a double diffused FET integrated circuit structure.
Figure 2B:
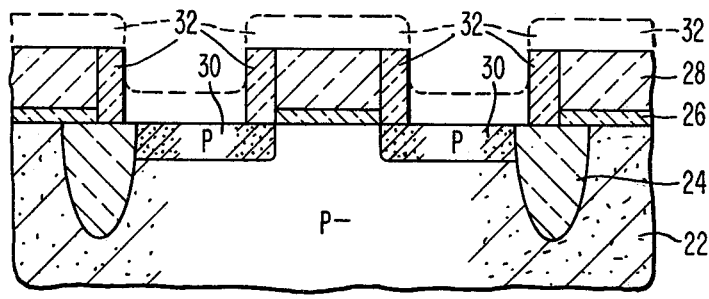

Referring now to FIGS. 2A through 2D, there is shown a method for forming a double diffused field effect transistor device with a flat doping profile and a short channel. FIG. 2A illustrates one small, greatly enlarged portion of a monocrystalline silicon body which will be used to form a very dense double diffused MOS field effect integrated circuit. A P− substrate of monocrystalline silicon 22 having a <100> crystallographic orientation and a resistance of the order of 1 to 20 ohms-cm is provided. Isolation means 24 is provided for isolating regions of the monocrystalline silicon substrate 22 from other regions of the monocrystalline silicon substrate. The isolation may be, for example, partial dielectric isolation or complete dielectric isolation. The dielectric materials used may be silicon dioxide, silicon nitride, glass, and so forth. The preferred isolation for highly dense integrated circuits is partial dielectric isolation as illustrated in FIG. 2A. There are many ways in the art to form dielectric isolation regions of this type. It is preferred to use the process described in the J. A. Bondur et al. patent application Ser. No. 824,361 filed Aug. 15, 1977, now U.S. Pat. No. 4,104,086, and assigned to the assignee of the present patent application. In that patent application, the process for forming partial dielectric isolation for the region 24 is described in detail.

A thin silicon dioxide layer 26 of the order of 1000 Angstroms in thickness is formed by either the thermal oxidation process or the chemical vapor deposition process. This layer 26 may be thermally grown in an oxygen-water vapor ambient at a temperature of about 970° C. A second method for growing silicon dioxide involves the use of chemical vapor deposition process wherein $SiH_4$, $O_2$ at about 450° C.; or $SiH_2Cl_2$, $N_2O$ at about 800° C. under atmospheric or low pressure conditions.

The layer 28 is, in this example, silicon nitride, and is formed by the chemical vapor deposition process using the following process conditions: $SiH_4$, $NH_3$ and $N_2$ carrier gas at a temperature of about 700° to 1100° C. under atmospheric or low pressure conditions as discussed in the V. Y. Doo U.S. Pat. No. 4,089,992. Alternate insulating layers or combinations thereof may be formed in place of the silicon dioxide and silicon nitride used in this embodiment.

Standard photolithography and etching techniques are utilized to make openings in the first insulator layer 26, 28. The openings in the layer 26, 28 are located where it is desired to have the source and drain of the double diffused MOS field effect devices. P-type ions are diffused through these openings to form the P regions 30 in the monocrystalline silicon substrate 22. These P impurities may be typically boron and the regions 30 may be formed by thermal diffusion or ion implantation techniques.

A second insulator layer 32 is formed on both the substantially horizontal surfaces 33 and vertical surfaces 34. This layer 32 in the present example is composed of chemical vapor deposited silicon dioxide according to the method described above. The operative thickness of the silicon dioxide is between about 500 to 20,000 Angstroms with 4000 Angstroms preferred. Should the thickness be greater than about 20,000 Angstroms, charge transfer problems and longer etching times occur. If the thickness is less than about 500 Angstroms, shorting problems occur.

The structure is placed in a suitable reactive ion etching ambient for the material of layer 32. The reactive ion etching process substantially removes the horizontal portion of layer 32 as indicated by the dashed lines and provides the narrow dimensioned vertical region shown in FIG. 2B.

Figure 2C:
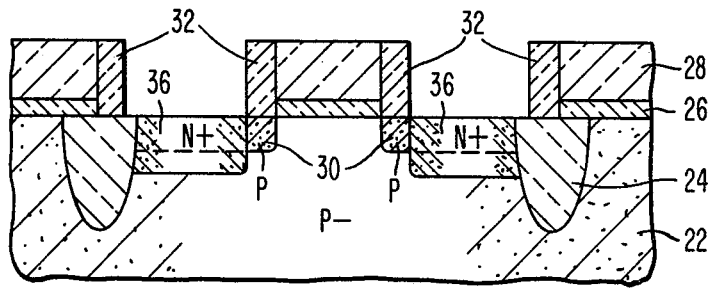
Figure 2D:
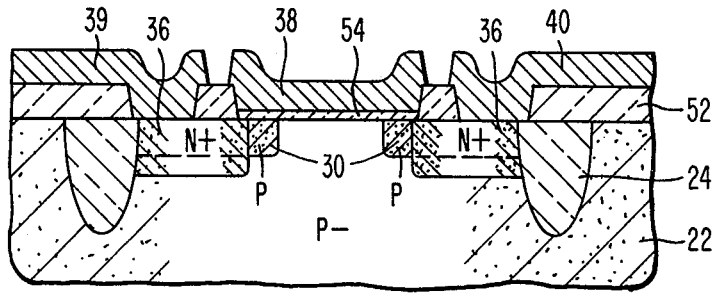

N+ ions are now diffused through the source and drain openings to form regions 36. This step may be accomplished by either the thermal diffusion or ion implantation techniques using phosphorus, arsenic or antimony, or the like, as the N dopant. The N+ region extends through region 36 deeper than the original P region 30 but not as wide because of the narrower opening. The opening has been narrowed by the thickness of the second layer 32 vertical dimensioned region. The resulting structure is shown in FIG. 2C. The preferred physical dimensions of the structure has the remaining P region of that FIG. 2C being approximately 5000 Angstroms in width and 2000 Angstroms in depth. The N+ region 36 being approximately 3000 Angstroms in depth. The structure shown in FIG. 2C has a smaller source/drain parasitic capacitance comparing with a more conventional double diffusion field effect transistor device where region 36 is surrounded entirely by the effective channel P region. The FET device may now be completed by forming the gate electrode 38 and the source and drain electrodes 39 and 40 by conventional conductor deposition involving lithography and etching techniques. Typically, regions 28, 26 and 32 will be etched away and an insulating layer 52, such as 3000 to 10,000 Å of silicon dioxide will be formed as shown in FIG. 2D. This insulating layer is now partially removed to expose the gate area. A thermally grown gate oxide 54, about 100 to 1000 Å thick is formed. Other parts of 52 are again removed to expose the source and drain contacts. The gate electrode 38 and the source and drain contacts 39, 40 are then formed by depositing a layer of conductor, such as 5000 Å of aluminum and then delineated. In this description, region 36 is formed after the diffusion of 30. For those skillful in the art, the processes may be reversed and obtaining a similar result. Namely, the vertical side wall 32 is first formed through RIE processes and region 36 is then diffused in. Now, etch away side wall 32 and then performing the 30 diffusion.

Figure 3A:
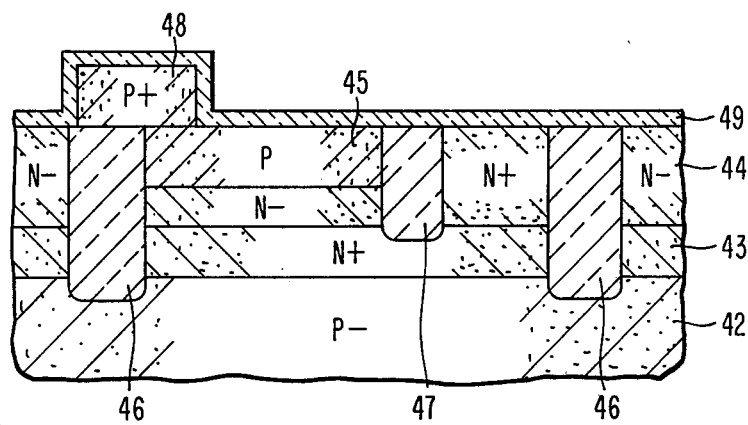
FIGS. 3A through 3F show a method for manufacturing a submicrometer emitter bipolar integrated circuit.

Referring now to the embodiment of FIGS. 3A through 3F for forming a bipolar, submicrometer emitter integrated circuit. FIG. 3A illustrates one small, greatly enlarged portion of a silicon body which will be used to form a very dense bipolar integrated circuit. This illustration uses NPN transistors but obviously PNP transistors can be formed using opposite conductivities. A P—substrate of monocrystalline silicon 42 has a blanket subcollector N+ diffusion 43 named therein. An epitaxial N— layer 44 is then grown on top of the substrate. These processes are standard processes in the formation, for example, of NPN bipolar transistors. The substrate is typically a <100> crystallographic orientation monocrystalline silicon wafer having a resistance of the order of 10 to 20 ohm-cm. The subcollector diffusion is formed using arsenic having a surface concentration of about $10^{20}/cm^3$ at 1000° to 1200° C. for about 100–300 minutes.

The epitaxial growth process to form the layer 44 may be by conventional techniques, such as the use of $SiCl_4/H_2$ or $SiH_4/H_2$ mixtures at temperatures about 1000° to 1200° C. During the epitaxial growth the dopant in the N+ layer moves into the epitaxial layer. The thickness of the epitaxial layer for highly dense integrated circuits is less than about 2 micrometers. A mask (not shown), such as thermally grown silicon dioxide, is formed on the surface of the epitaxial layer and by suitable photolithographic and etching techniques has mask openings formed therein in the areas where dielectric isolation between regions of monocrystalline silicon and between regions designated as the base emitter area and the collector reach-through area are to be separated. FIG. 3A shows the partial dielectric isolation with dielectric regions 46 isolating monocrystalline silicon regions of the silicon body from one another and a region 47 which isolates the base emitter region from the collector reach-through region. There are many ways in the art to form dielectric regions of this type. It is preferred to use the beforementioned mask and the reactive ion etching process for silicon described in the J. A. Bondur, et al patent application Ser. No. 824,361, filed Aug. 15, 1977, now U.S. Pat. No. 4,104,086, and assigned to the assignee of the present invention. In that patent application the reactive ion etching to form depressions through the mask openings and thereafter filling of the depressions with silicon dioxide dielectric isolation for the regions 46 and 47 is described in detail.

The surface of the monocrystalline silicon structure is masked using standard silicon dioxide, photolithography and etching techniques to form openings in the silicon dioxide mask where the base region is desired. A P type base region 45 is formed by ion implantation or thermal diffusion techniques with a surface concentration of about $5 \times 10^{19}/cm^3$ at about 925° C. for about 40 minutes. The surface of the structure has then all silicon dioxide removed therefrom and polycrystalline silicon deposited by a chemical vapor deposition process to form a layer of about 5000 Å thick according to the process described above.

Figure 3B:
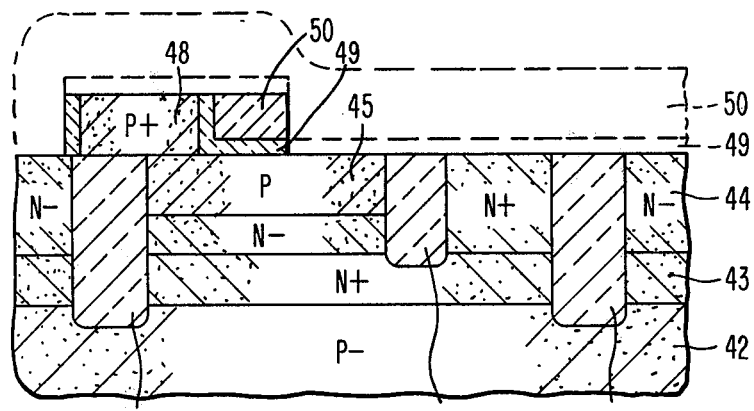
Figure 3C:
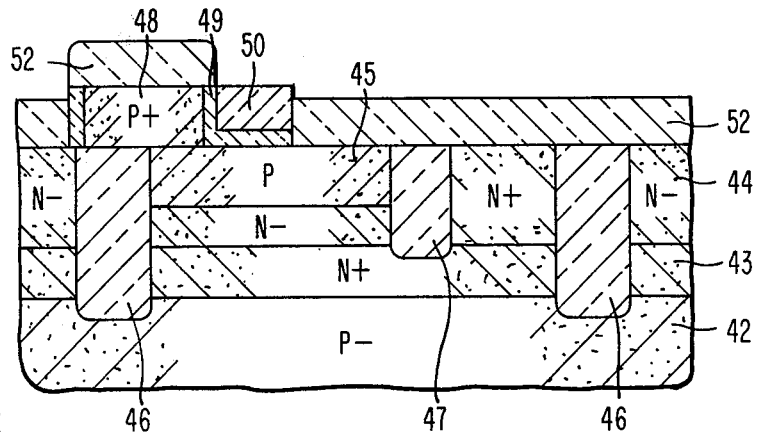
Figure 3D:
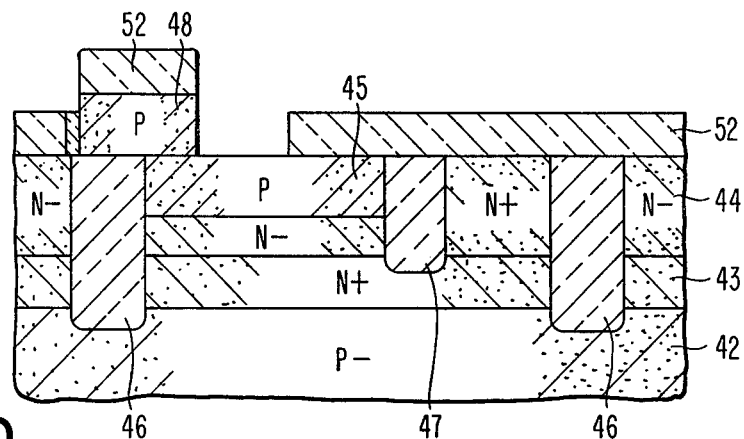
Figure 3E:
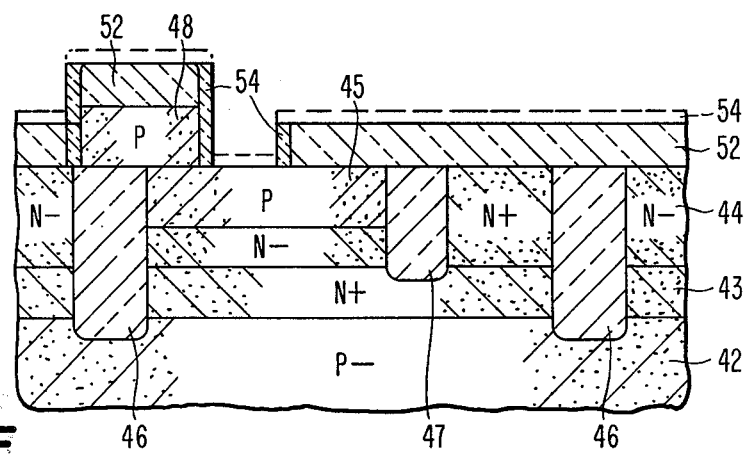
Figure 3F:
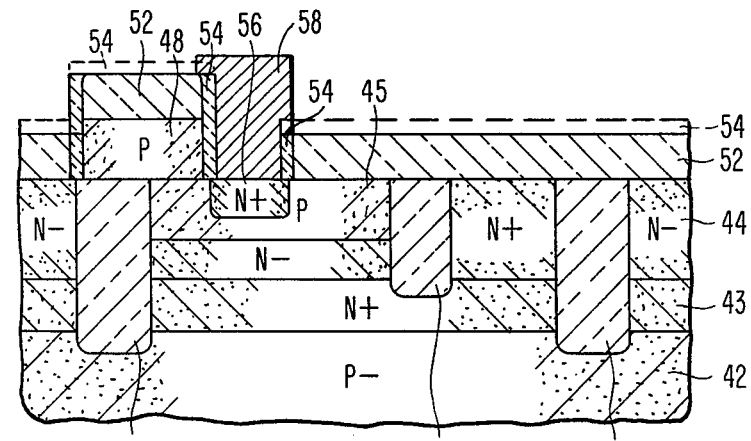

The layer 48 is designated to be the contact for the base region 45, and layer 48 therefore is P+ doped for adequate contact to a P base region and remains only over the base regions and the dielectric isolation regions after the etching step. The resulting structure is that of FIG. 3A wherein the first layer is P+ polycrystalline silicon layer 48 and a thin silicon dioxide layer 49 thermally grown thereover. The thickness of layer 49 is about 100–500 Å. The etched first layer now has substantially horizontal surfaces and substantially vertical surfaces. A second layer 50 composed of an insulator material and a material different from that of the first layer is formed upon the substantially horizontal surfaces and the substantially vertical surfaces. The layer in this particular embodiment is preferred to be silicon nitride. The silicon nitride deposition is by the chemical vapor deposition process described above. The thickness of the second insulating layer is between about 3000 to 8000 Angstroms and preferably 5000 Angstroms. The thickness of the layer will tailor the size of the emitter openings desired. The FIG. 3B structure is put in a reactive ion etching ambient for silicon nitride and the silicon nitride layer 50 is substantially removed from all horizontal surfaces and leaving the region 50 on the vertical surfaces as shown in FIG. 3B. The dashed lines indicate the presence of the silicon nitride layer 50 prior to reactive ion etching. The thin silicon dioxide layer 49 is also removed in this embodiment by the reactive ion etching ambient. Silicon dioxide is now thermally grown on the bare silicon surfaces and the polysilicon region to form layer 52. The thickness of layer 52 is about 1000–5000 Å. It is important that layer 52 should be much thicker than layer 49.

The narrow dimensioned silicon nitride region 50 is etched using a suitable etchant which is hot $H_3PO_4$ or a suitable plasma. The remaining thin silicon dioxide layer 49 underneath the silicon nitride layer 50 is etched using buffered HF or suitable plasma etchant. This etchant will attack layer 52 as well. However, only a small percentage of layer 52 will be etched The FIG. 3D structure is placed in a thermal oxidizing ambient of water vapor and oxygen at about 970° C. to grow a thin silicon dioxide layer 54 over the structure. This results in the structure of FIG. 3E. A reactive ion etching process is then performed to remove all layer 54 except the side wall. The very narrow dimensioned emitter region 56 is formed using either thermal diffusion or ion implantation techniques with arsenic or phosphorus as the emitter dopant. A suitable metal contact 58 is formed by blanket deposition of the metal followed by standard photolithography and etching techniques to connect the various elements of the structure by the desired metal pattern.

While the invention has been particularly shown and described with reference to the preferred embodiments thereof, it will be understood by those skilled in the art that various changes in form and detail may be made therein without departing from the spirit and scope of the invention.

Having thus described our invention, what we claim as new, and desire to secure by Letters Patent is:

1. A method for forming a narrow dimensioned mask opening on a silicon body for subsequent processing comprising:
   providing a silicon body;
   forming on said body first insulator regions having substantially horizontal surfaces and substantially vertical surfaces;
   forming a second insulator layer composed of a material different from said first insulator on both said substantially horizontal surfaces and said substantially vertical surfaces;
   reactive ion etching said second layer to substantially remove said horizontal layer and to provide a narrow dimensioned second insulator region on said silicon body;
   thermally oxidizing the exposed surfaces of said silicon body; and removing said narrow dimensioned second insulator region to form said narrow dimensioned mask opening.

2. The method of claim 1 wherein said first insulator is silicon dioxide and said second insulator is silicon nitride.

3. The method of claim 1 wherein said first insulator is silicon dioxide and said second insulator is aluminum oxide.

4. The method of claim 2 wherein a layer of silicon dioxide is formed between said silicon body and said silicon nitride.

5. The method of claim 1 wherein said mask opening is less than about 20,000 Å in width and a conductivity altering impurity is diffused therethrough.

6. The method of claim 1 and further comprising diffusing a conductivity altering impurity through said mask opening to form a diffused region in said body and subjecting the structure to an oxidizing ambient to oxidize the surface of said diffused region.

7. The method of claim 6 wherein the said diffusing is by ion implantation.

8. The method of claim 6 wherein a portion of said silicon body is removed through said mask opening before said subjecting the structure to an oxidizing ambient so as to make the resulting oxidized surface closely planar with the surface of said silicon body.

9. The method of claim 8 wherein the said diffusing is by thermal diffusion.

10. A method for forming double diffused field effect transistor integrated circuit structure comprising:
providing a silicon body having a pattern of monocrystalline silicon regions isolated from one another by dielectric isolation;
forming on said body a first insulator layer;
forming openings in said insulator layer in areas where source and drain for said field effect transistor are to be formed and which result in first insulator regions having substantially horizontal surfaces and substantially vertical surfaces;
diffusing a P type impurity through said openings to form P regions in said silicon body;
forming a second insulator layer composed of a material different from said first insulator on both said substantially horizontal surfaces and said substantially vertical surfaces;
reactive ion etching said second layer to substantially remove said horizontal layer and to provide a narrow dimensioned second insulator region on said silicon body;
diffusing an N type impurity through the said openings which have been reduced in size by said narrow dimensioned second insulator region on said silicon body to form N type regions in said silicon body which are deeper and narrower than said P type regions; and
forming contacts to said sources and drains and making a gate electrode on the first insulator between each of the sources and drains.

11. The method of claim 10 wherein said first insulator layer is composed of silicon nitride and said second insulator layer is composed of silicon dioxide.

12. The method of claim 10 wherein the said diffusing is accomplished by the thermal diffusion process.

13. The method of claim 10 wherein the said diffusing is accomplished by the ion implantation process.

14. The method of claim 10 wherein said dielectric isolation is composed of silicon dioxide.

15. A method for forming double diffused field effect transistor integrated circuit structure comprising:
providing a silicon body having a pattern of monocrystalline silicon regions isolated from one another by dielectric isolation;
forming on said body a first insulator layer;
forming openings in said insulator layer in areas where source and drain for said field effect transistor are to be formed and which result in first insulator regions having substantially horizontal surfaces and substantially vertical surfaces;
diffusing a N type impurity through said openings to form N regions in said silicon body;
forming a second insulator layer composed of a material different from said first insulator on both said substantially horizontal surfaces and said substantially vertical surfaces;
reactive ion etching said second layer to substantially remove said horizontal layer and to provide a narrow dimensioned second insulator region on said silicon body;
diffusing a P type impurity through the said openings which have been reduced in size by said narrow dimensioned second insulator region on said silicon body to form P type regions in said silicon body which are deeper and narrower than said N type regions; and
forming contacts to said sources and drains and making a gate electrode on the first insulator between each of the sources and drains.

16. A method for forming a bipolar integrated circuit structure having submicrometer emitters comprising:
providing a silicon body having a pattern of monocrystalline silicon regions isolated from one another by dielectric isolation;
providing a base region within certain of said monocrystalline regions separated from a collector reach-through region by dielectric isolation;
forming on said body first layer having substantially horizontal surfaces and substantially vertical surfaces;
forming a second layer composed of an insulator material and of a material different from said first layer on both said substantially horizontal surfaces and said substantially vertical surfaces;
reactive ion etching said second layer to substantially remove said horizontal layer and to provide narrow dimensioned second insulator regions on said silicon body in the areas designated to be said emitters;
thermally oxidizing the exposed surfaces of said silicon body;
removing said narrow dimensioned second regions to form said narrow dimensioned mask openings; and
forming said emitters through said mask openings.

17. The method of claim 16 wherein said first layer comprises a conductive polycrystalline silicon layer which makes electrical contact to said base regions and a thin silicon dioxide layer thereover.

18. The method of claim 17 wherein the said second insulator layer is silicon nitride.

19. The method of claim 17 wherein the said base regions are abutted against said dielectric isolation.

20. The method of claim 19 wherein the said emitters are abutted against said dielectric isolation.

* * * * *